United States Patent
Irron et al.

(10) Patent No.: US 7,253,522 B2
(45) Date of Patent: Aug. 7, 2007

(54) INTEGRATED CAPACITOR FOR RF APPLICATIONS WITH TA ADHESION LAYER

(75) Inventors: Elad Irron, Gush Segev (IL); Eitan Avni, Karmiel (IL)

(73) Assignee: AVX Israel, Ltd., Jerusalem (IL)

( * ) Notice: Subject to any disclaimer, the term of this patent is extended or adjusted under 35 U.S.C. 154(b) by 101 days.

(21) Appl. No.: 11/131,370

(22) Filed: May 18, 2005

(65) Prior Publication Data

US 2005/0272246 A1   Dec. 8, 2005

Related U.S. Application Data

(60) Provisional application No. 60/575,819, filed on Jun. 2, 2004, provisional application No. 60/654,508, filed on Feb. 22, 2005.

(51) Int. Cl.
*H01L 23/48* (2006.01)
*H01L 23/52* (2006.01)
*H01L 29/40* (2006.01)

(52) U.S. Cl. ............... 257/760; 257/411; 257/751; 257/761; 257/E21; 257/8; 257/48; 257/202; 257/21

(58) Field of Classification Search ............ 257/760, 257/761, 762, 310, 410, 411, 701, 486, 763, 257/769, 759, 771, 774
See application file for complete search history.

(56) References Cited

U.S. PATENT DOCUMENTS

| | | | |
|---|---|---|---|
| 5,225,969 A | 7/1993 | Takay et al. | |
| 5,363,080 A | 11/1994 | Breen | |
| 5,576,240 A * | 11/1996 | Radosevich et al. | 438/396 |
| 6,156,655 A * | 12/2000 | Huang et al. | 438/687 |
| 6,170,254 B1 * | 1/2001 | Cariola | 60/226.2 |
| 6,252,290 B1 * | 6/2001 | Quek et al. | 257/522 |
| 6,265,779 B1 * | 7/2001 | Grill et al. | 257/759 |
| 6,498,364 B1 | 12/2002 | Downey et al. | |
| 6,538,300 B1 | 3/2003 | Goldberger et al. | |
| 6,621,142 B2 | 9/2003 | Goldberger et al. | |
| 6,712,983 B2 * | 3/2004 | Zhao et al. | 216/2 |
| 6,720,604 B1 | 4/2004 | Fritzinger et al. | |
| 6,764,774 B2 * | 7/2004 | Grill et al. | 428/641 |
| 6,781,185 B2 * | 8/2004 | Chen et al. | 257/310 |

OTHER PUBLICATIONS

Shareef et al; Subatmospheric chemical vapor deposition ozone/ TEOS process for SiO2 trench filling; J of Vac. Sci. Technol. Jul./Aug. 1995 pp. 1888-1892.

* cited by examiner

*Primary Examiner*—David Nhu
(74) *Attorney, Agent, or Firm*—Simon Kahn

(57) ABSTRACT

A precision RF passive component including: a silicon substrate; a first dielectric layer deposited above the silicon substrate; a first metal layer formed above the first dielectric layer; a second dielectric layer formed above the first metal layer; and a second metal layer formed above the second dielectric layer. In one embodiment a passivation layer is added above the second metal layer. In an exemplary embodiment the first metal layer includes a first adhesion layer, a metal sub-layer, and a second adhesion layer; and the second dielectric layer includes a first diffusion barrier layer, a dielectric sub-layer second diffusion barrier. In an exemplary embodiment, the metal sub-layer includes copper. In another exemplary embodiment the dielectric sub-layer includes $SiO_2$ or $Si_3N_4$ between diffusion barrier layers including SiN.

16 Claims, 2 Drawing Sheets

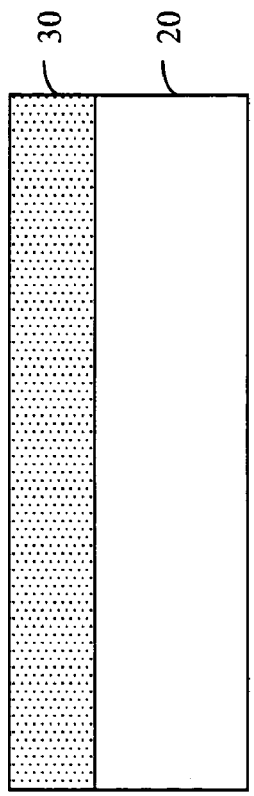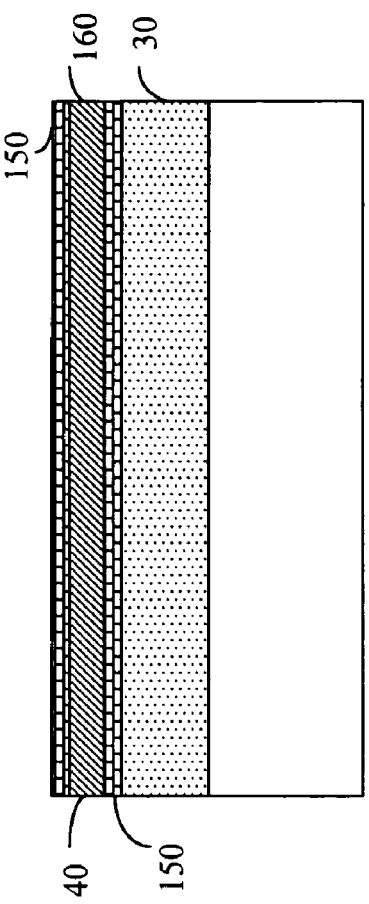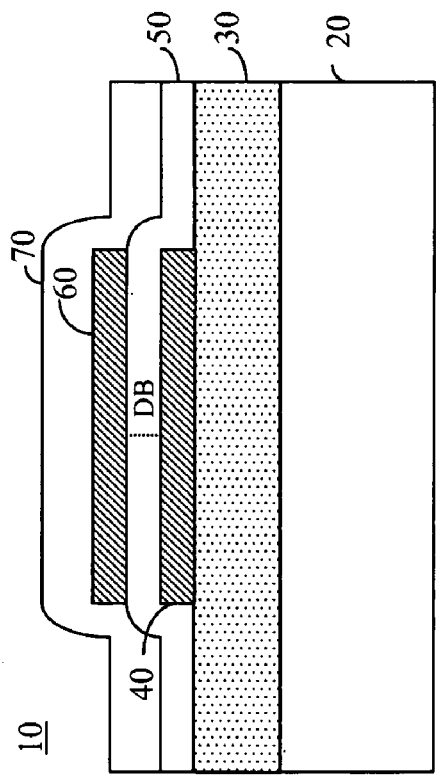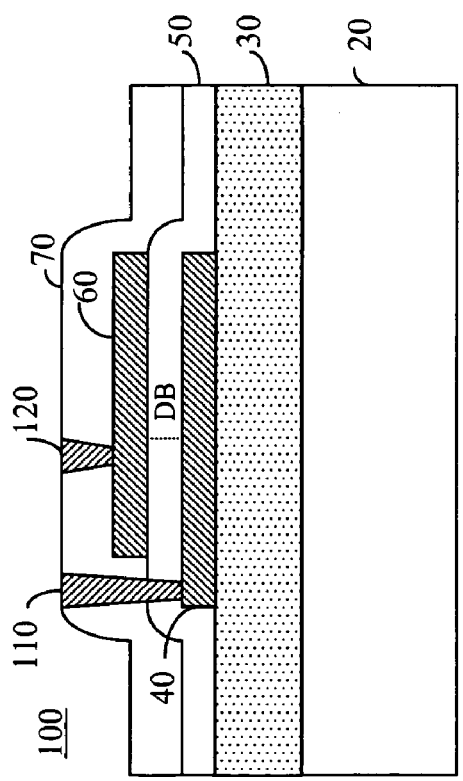
Fig. 1a
Fig. 1b
Fig. 2a
Fig. 2b

INTEGRATED CAPACITOR FOR RF APPLICATIONS WITH TA ADHESION LAYER

CROSS-REFERENCE TO RELATED APPLICATIONS

This application claims priority from provisional patent application Ser. No. 60/575,819 filed Jun. 2, 2004 entitled "Integrated Capacitor for RF Applications" and provisional patent application Ser. No. 60/654,508 filed Feb. 22, 2005 entitled "Method Suitable for Batch Ion Etching of Copper" the contents of both of which are incorporated herein by reference, and is related to co-filed patent application entitled "Method Suitable for Batch Ion Etching of Copper" the contents of which is incorporated herein by reference.

BACKGROUND OF THE INVENTION

The invention relates generally to the field of semiconductor technology and in particular to a layered high frequency capacitor suitable for RF applications.

The increasing need for communications has been a consistent driver for expanding the spectrum utilized for wireless communications. In recent years frequencies in excess of 10 GHz have become commonplace in satellite video and data transmission, while frequencies up to 3 GHz are common in cellular communications. In general, components designed for such high frequencies are also known as radio frequency (RF) components. The generation and detection of RF requires precision passive electronic components, such as capacitors, inductors and resonant filters. Unfortunately, precision passive electronic components are typically expensive and as such prevent the rapid spread of technology based on these frequencies.

Semiconductor manufacturing technology is well developed, and is an excellent technology for reducing the cost of devices and components, while maintaining a high level of precision and repeatability. Many prior art techniques exist for manufacturing capacitors, unfortunately the need for high precision as required for RF applications, and low cost has not been met. In particular a number of barriers to precision control include diffusion of any deposited metal, lack of adhesion of a deposited metal to a dielectric and precision control of the height of a dielectric.

U.S. Pat. No. 6,498,364 issued to Downey et al. describe a capacitor for use in a semiconductor device having a damascene interconnect structure, such as a dual damascene interconnect, formed over a substrate of a semiconductor wafer. The use of a damascene structure adds complexity in the processing due to the polishing required. This increases the end cost of the devices.

U.S. Pat. Nos. 6,538,300 and 6,621,142 issued to Goldberger et al. is addressed to a precision high frequency capacitor including a dielectric layer formed on the front side surface of a semiconductor substrate and a first electrode on top of the dielectric layer. The semiconductor substrate is heavily doped to provide for an electronic discharge protection diode. The use of a heavily doped substrate increases the RF losses in the capacitor and inhibits the integration of inductors or filters.

Thus, there is a need for a precision RF passive component, such as a capacitor, which is preferably suitable for low cost production and integration with other RF components on a single common substrate.

SUMMARY OF THE INVENTION

Accordingly, it is a principal object of the present invention to overcome the disadvantages of prior art precision RF passive components. This is provided in the present invention by providing an RF passive component comprising: a silicon substrate upon which has been formed a first dielectric layer; a first metal layer formed above the first dielectric layer; a second dielectric layer formed above the first metal layer; a second metal layer formed above the second dielectric layer; and a passivation layer formed above the second metal layer. In a preferred embodiment the first metal layer comprises a first adhesion sub-layer, a metal sub-layer and a second adhesion sub-layer, and the second dielectric layer comprises a first diffusion barrier sub-layer a dielectric sub-layer and a second diffusion barrier sub-layer.

The invention provides for: a precision RF passive component comprising: a silicon substrate; a first dielectric layer deposited above the silicon substrate; a first metal layer formed above the first dielectric layer; a second dielectric layer formed above the first metal layer; and a second metal layer formed above the second dielectric layer.

In one embodiment the precision RF passive component further comprises a passivation layer formed above the second metal layer. In another embodiment the first metal layer comprises: a first adhesion layer; a metal sub-layer deposited above the first adhesion layer; and a second adhesion layer deposited above the metal sub-layer.

In another embodiment the second metal layer comprises a first adhesion layer and a metal sub-layer deposited above the first adhesion layer. Preferably, the second metal layer further comprises a second adhesion layer deposited above the metal sub-layer. In another embodiment the first dielectric layer comprises $SiO_2$.

In yet another embodiment the second dielectric layer comprises: a first diffusion barrier layer; a dielectric sub-layer; and a second diffusion barrier layer. In one further preferred embodiment at least one of the first diffusion barrier layer and the second diffusion barrier layer comprise $Si_3N_4$. In another further preferred embodiment the dielectric sub-layer comprises one of SiON and $SiO_2$. In yet another further preferred embodiment each of the first and second diffusion barrier layers are less than 1500 Angstroms in height. In another further preferred embodiment the first metal layer comprises: a first adhesion layer; a metal sub-layer deposited above the first adhesion layer; and a second adhesion layer deposited above the metal sub-layer. Preferably, the second metal layer comprises a first adhesion layer and a metal sub-layer deposited above the first adhesion layer. Further preferably the second metal layer further comprises a second adhesion layer deposited above the metal sub-layer. Even further preferably the RF passive component comprising a passivation layer formed above the second metal layer.

In one further preferred embodiment at least one of the metal sub-layer of the first metal layer and the metal sub-layer of the second metal layer comprises one of copper, gold and platinum. In another further preferred embodiment at least one of the first adhesion layer of the first metal layer, the second adhesion layer of the first metal layer, and the first adhesion layer of the second metal layer comprise tantalum.

In one embodiment the precision RF passive component comprises one of a capacitor, inductor and a resonant filter.

The invention independently provides for a method of forming an RF passive component on a substrate comprising: depositing a first dielectric layer deposited above the silicon substrate; forming a first metal layer above the first dielectric layer; depositing a second dielectric layer above the first metal layer; and forming a second metal layer formed above the second dielectric layer.

In one embodiment the forming a first metal layer comprises: depositing a first adhesion layer; forming a metal sub-layer above the first adhesion layer; and depositing a second adhesion layer above the metal sub-layer. In another embodiment the depositing a second dielectric layer comprises: depositing a first diffusion barrier layer; depositing a dielectric sub-layer; and depositing a second diffusion barrier layer.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 1a illustrates a side view of an RF component according to an embodiment of the principle of the invention;

FIG. 1b illustrates a side view of an RF component according to an embodiment of the principle of the invention showing the presence of vias;

FIGS. 2a-2f illustrate stages in the production of an RF component according to the principle of the invention.

DETAILED DESCRIPTION OF THE PREFERRED EMBODIMENTS

Figure 2E:
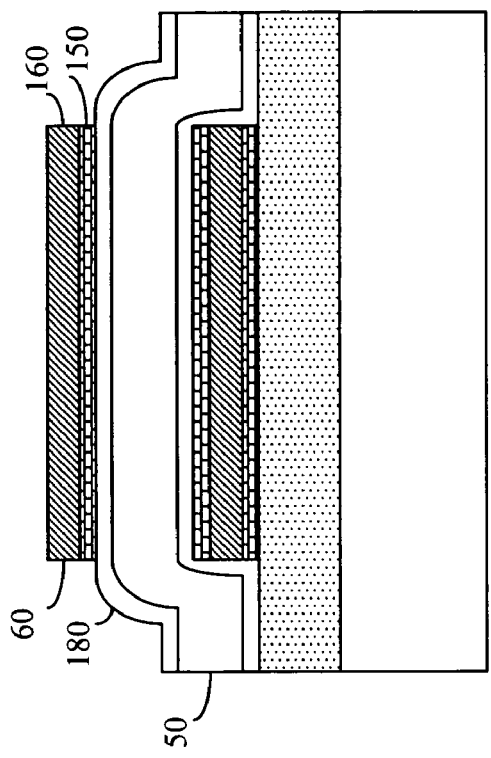

The present embodiments enable an improved precision RF passive component. This is provided in the present invention by providing: a silicon substrate upon which has been formed a first dielectric layer; a first metal layer formed above the first dielectric layer; a second dielectric layer formed above the first metal layer; a second metal layer formed above the second dielectric layer; and an optional passivation layer formed above the second metal layer. Preferably, the second dielectric layer comprises a first diffusion barrier layer; an intermediate dielectric sub-layer formed to a precise height; and a second diffusion barrier layer. In an exemplary embodiment at least one of the first and second diffusion barrier layers comprise $Si_3N_4$. In a further preferred embodiment the dielectric sub-layer comprises one of $SiO_2$ or SiON. Preferably the $SiO_2$ dielectric sub-layer is formed from TEOS (Tetra-Ethyl-Ortho-Silicate).

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1a illustrates a side view of an RF component 10 produced according to an embodiment of the principle of the invention. RF component 10 comprises a substrate 20; a first dielectric layer 30 formed on substrate 20; a first metal layer 40 formed on first dielectric layer 30; a second dielectric layer 50 burying first metal layer 40; a second metal layer 60 formed on second dielectric layer 50 and a passivation layer 70 burying second metal layer 60. The height of second dielectric layer 50 is identified as DB, and is precisely controlled as will be further described hereinto below. Connections to first metal layer 40 and second metal layer 60 are not shown for clarity.

Precision control of height DB is important to ensure proper operation of RF passive component 10. First and second metal layers 40 and 60, respectively, typically tend to diffuse into any adjacent layers. Furthermore, low cost metal layers, such as copper, require additional attention to ensure proper adhesion between the metal layer and any adjacent layers. Preferably a diffusion barrier prevents diffusion from both the top and side walls of first and second metal layers 40 and 60, respectively. The invention is being described herein with subsequent layers being deposited directly on layers below. This is not meant to be limiting in any way, and additional layers may be deposited between layers herein described as being deposited on a lower layer without exceeding the scope of the invention.

FIG. 1b illustrates a side view of an RF component 100 produced according to an embodiment of the principle of the invention illustrating vias for connection. RF component 100 comprises a substrate 20; a first dielectric layer 30 formed on substrate 20; a first metal layer 40 formed on first dielectric layer 30; a second dielectric layer 50 burying first metal layer 40; a second metal layer 60 formed on second dielectric layer 50; a passivation layer 70 burying second metal layer 60; first via 110 formed to enable connection from above passivation layer 70 to first metal layer 40; and second via 120 formed to enable connection from above passivation layer 70 to second metal layer 60. Optionally, an additional via (not shown) is formed between first metal layer 40 and second metal layer 60 to enable contact to second metal layer 60. The height of second dielectric layer 50 is identified as DB, and is precisely controlled as will be further described hereinto below. RF component 100 is similar to RF component 10, with the addition of first and second vias 110, 120.

FIG. 2a illustrates a first stage in the production of RF component 10 of FIG. 1a. First dielectric layer 30 is deposited above substrate 20. In a preferred embodiment, first dielectric layer 30 comprises $SiO_2$. In an exemplary embodiment, first dielectric layer 30 is formed by one of thermal oxidation; plasma enhanced chemical vapor deposition (PECVD); high pressure oxidation (HIPOX); or chemical vapor deposition (CVD) of TEOS. First dielectric layer 30 isolates first metal layer 40 of RF component 10 from silicon substrate 20.

FIG. 2b illustrates a second stage in the production of RF component 10 of FIG. 1a. First adhesion layer 150 is deposited on first dielectric layer 30; metal sub-layer 160 is deposited on first adhesion layer 150; and second adhesion layer 150 is deposited on metal sub-layer 160. In a preferred embodiment first and second adhesion layers 150 comprise tantalum (Ta) and metal layer 160 comprises copper (Cu). Cu is preferred due its low cost, however this is not meant to be limiting in any way, and metal sub-layer 160 may comprise gold, aluminum or platinum without exceeding the scope of the invention. Ta is preferred as an adhesion layer as it can be deposited in one process step, the method of deposition being similar to that of Cu. In another embodiment TaN is used for at least one of first and second adhesion layer 150. There is no requirement that each of first and second adhesion layers 150 be identically constituted. First metal layer 40 of RF component 10 thus comprises the combination of first adhesion layer 150, metal sub-layer 160 and second adhesion layer 150. It is to be understood by those skilled in the art that a single mask is used to define first metal layer 40 using photoresist and ion etching.

Figure 2F:
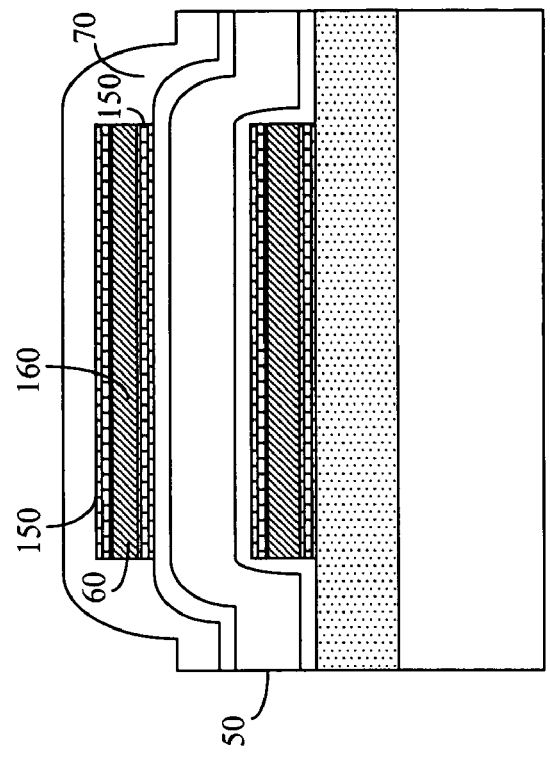
Figure 2C:
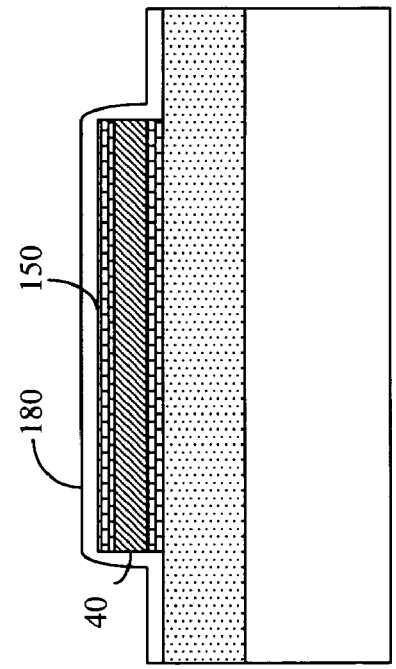

FIG. 2c illustrates a third stage in the production of RF component 10 of FIG. 1a. First diffusion barrier layer 180 is deposited above second adhesion layer 150 to bury first metal layer 40. First metal layer 40 is here shown after ion etching. In a preferred embodiment, first diffusion barrier layer 180 comprises $Si_3N_4$. In another embodiment first diffusion barrier layer 180 comprises one of TaN and TaSiN. In an exemplary embodiment first diffusion barrier layer 180 is deposited using one of physical vapor deposition (PVD) with reactive sputtering and PECVD. PVD is preferred since it provides good conformal coating and step coverage, and is deposited at a lower temperature than PECVD.

Preferably first diffusion barrier layer 180 is deposited to a height of less than 1500 Angstrom. In an exemplary embodiment, the height of first diffusion barrier layer 180 is approximately 1000 Angstrom. The small height of first diffusion barrier layer 180 is preferred due to a low deposition rate of $Si_3N_4$, high dielectric constant, low thickness accuracy, and internal stress. A unique feature of the invention is that first diffusion barrier layer 180 covers both the top and sides of first metal layer 40. TaN and TaSiN can serve as diffusion barriers as well.

Figure 2D:
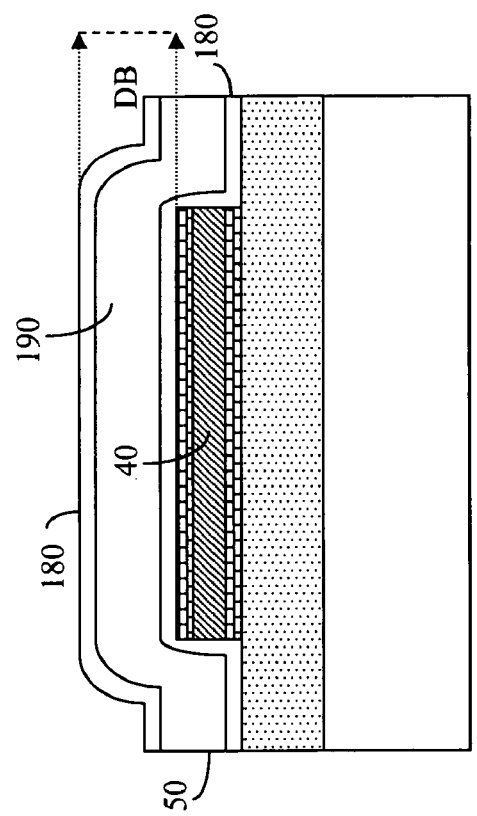

FIG. 2d illustrates a fourth stage in the production of RF component 10 of FIG. 1a. Dielectric sub-layer 190 is deposited over first diffusion barrier layer 180. Second diffusion barrier layer 180 is deposited over dielectric sub-layer 190. Second dielectric layer 50 of RF component 10 of FIG. 1a thus comprises the combination of first diffusion barrier layer 180, dielectric sub-layer 190 and second diffusion barrier layer 180. Dielectric sub-layer 190 is deposited to a precisely controlled height, defining height DB of first dielectric layer 50 and thus the proper operation of RF component 10. In a first preferred embodiment dielectric sub-layer 190 comprises $SiO_2$. In a second preferred embodiment, dielectric sub-layer 190 comprises SiON. Criteria for selection of the appropriate material for dielectric sub-layer 190 comprise: desired height DB; accuracy of the height at which dielectric sub-layer 190 can be deposited; and temperature of deposition. Temperatures in excess of 250° C. have a tendency to cause increased diffusion of first metal layer 40.

In an exemplary embodiment, dielectric sub-layer 190 is deposited using PECVD or low pressure chemical vapor deposition (LPCVD) of TEOS at a temperature less than or equal to 320° C. In another embodiment SiON is deposited using PECVD or LPCVD at a temperature less than or equal to 320° C. The height of dielectric sub-layer 190 is the primary component of DB, and can be carefully controlled. Current commercially available technology enables precise height control of a deposited $SiO_2$ or SiON layer up to an overall height of 2 microns. This is not meant to be limiting in any way and heights in excess of 2 microns are specifically included. In an exemplary illustrative embodiment, first and second diffusion barrier layers 180 each comprise a 1000 Angstrom layer of $Si_3N_4$ and dielectric sub-layer 190 comprises an 8000 Angstrom layer of SiON.

FIG. 2e illustrates a fifth stage in the production of RF component 10 of FIG. 1a. Third adhesion layer 150 is deposited over second diffusion barrier layer 180, and second metal sub-layer 160 is deposited over second diffusion barrier layer 180. Third adhesion layer 150 is in all respects similar to first and second adhesion layers 150 described above in relation to FIG. 2b. A unique feature of an embodiment of the invention is that third adhesion layer 150 is separate and distinct from second diffusion barrier layer 180. Second metal sub-layer 160 is in all respects similar to first metal sub-layer 160, however this is not meant to be limiting in any way. Second metal sub-layer 160 may be of different size or composition than first metal sub-layer 160 without exceeding the scope of the invention. Second metal layer 60 of RF component 10 of FIG. 1a thus comprises third adhesion layer 150 and second metal sub-layer 160. It is to be understood by those skilled in the art that a single mask is used to define second metal sub-layer 60 using photoresist and ion etching.

FIG. 2f illustrates a sixth stage in the production of RF component 10 of FIG. 1a. An optional fourth adhesion layer 150 is shown deposited on second metal sub-layer 160 to enable good adhesion between second metal sub-layer 160 and passivation layer 70. In such an embodiment second metal layer 60 of RF component 10 comprises third adhesion layer 150, second metal sub-layer 160 and fourth adhesion layer 150. Passivation layer 70 is deposited burying second metal layer 60. Second metal layer 60 is here shown after ion etching.

Contacts as required to first metal layer 40 and second metal layer 60 may be deposited using vias in a manner known to those skilled in the art. RF component 100 of FIG. 1b illustrates an embodiment of RF component 10 in which first via 110 has been deposited to enable connection to first metal layer 40 and second via 120 has been deposited to enable connection to second metal layer 60.

Thus the present embodiments enable an improved precision RF passive component by providing a silicon substrate upon which has been formed a first dielectric layer; a first metal layer formed above the first dielectric layer; a second dielectric layer formed above the first metal layer; a second metal layer formed above the second dielectric layer; and an optional passivation layer formed above the second metal layer. Preferably, the second dielectric layer comprises a first diffusion barrier layer; an intermediate dielectric sub-layer formed to a precise height; and a second diffusion barrier layer. In an exemplary embodiment at least one of the first and second diffusion barrier layers comprise $Si_3N_4$. In a further preferred embodiment the dielectric sub-layer comprises one of $SiO_2$ or SiON. Preferably the $SiO_2$ dielectric sub-layer is formed from TEOS.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

We claim:

1. A precision RF passive component comprising:
   a substrate;
   a first dielectric layer deposited above said substrate;
   a first metal layer formed above said first dielectric layer;
   a second dielectric layer formed above said first metal layer; and
   a second metal layer formed above said second dielectric layer,
   wherein said first metal layer comprises:
   a first adhesion layer;
   a metal sub-layer deposited above the first adhesion layer;
   and a second adhesion layer deposited above the metal sub-layer,
   at least one of said first adhesion layer of said first metal layer and said second adhesion layer of said first metal layer comprising tantalum.

2. A precision RF passive component comprising:
   a substrate;
   a first dielectric layer deposited above said substrate;
   a first metal layer formed above said dielectric layer;
   a second dielectric layer formed above said first metal layer; and
   a second metal layer formed above said second dielectric layer,
   wherein said second metal layer comprises:
   a first adhesion layer comprising tantalum; and
   a metal sub-layer deposited above the first adhesion layer.

3. The precision RF passive component according to claim 2, wherein said second metal layer further comprises a second adhesion layer deposited above the metal sub-layer.

4. The precision RF passive component according to claim 3, wherein said second adhesion layer of said second metal layer comprises tantalum.

5. The precision RF passive component according to claim 3, wherein said second dielectric layer comprises: a first diffusion layer; a dielectric sub-layer; and a second diffusion barrier layer.

6. The precision RF passive component according to claim 2, wherein said tantalum of said first adhesion layer of said second metal layer is TaN.

7. The precision RF passive component according to claim 4, wherein said tantalum of said second adhesion layer of said second metal layer is TaN.

8. The precision RF passive component according to claim 1, wherein said tantalum of said at least one of said first adhesion layer of said first metal layer and said second adhesion layer of said first metal layer is TaN.

9. The precision RF passive component according to claim 1, wherein said second metal layer comprises:
   a first adhesion layer;
   a metal sub-layer deposited above the first adhesion layer; and
   a second adhesion layer deposited above the metal sub-layer,
   at least one of said first adhesion layer of said second metal layer and said second adhesion layer of said second metal layer comprising tantalum.

10. A precision RF passive component according to claim 1, wherein said second metal layer comprises:
    a first adhesion layer comprising tantalum; and
    a metal sub-layer deposited above the first adhesion layer.

11. The precision RF passive component according to claim 10, wherein said tantalum of said first adhesion layer of said second metal layer is TaN.

12. The precision RF passive component according to claim 11, further comprising a passivation layer formed above the second metal layer.

13. The precision RF passive component according to claim 10, wherein at least one of said metal sub-layer of said first metal layer and said metal sub-layer of said second metal layer comprises one of copper, gold, aluminum and platinum.

14. The precision RF passive component according to claim 9, wherein said tantalum of said at least one of said first adhesion layer of said second metal layer and said second adhesion layer of said second metal layer is TaN.

15. A precision RF passive component comprising:
    a substrate;
    a first dielectric layer deposited above said substrate;
    a first metal layer formed above the said dielectric layer;
    a second dielectric layer formed above said first metal layer; and
    a second metal layer formed above said second dielectric layer,
    wherein said second metal layer comprises:
    a first adhesion layer;
    a metal sub-layer deposited above said first adhesion layer; and
    a second adhesion layer deposited above the metal sub-layer,
    at least one of said first adhesion layer of said second metal layer and said second adhesion layer of said second metal layer comprising tantalum.

16. A precision RF passive component according to claim 15, wherein said tantalum of said at least one of said first adhesion layer of said second metal layer and said second adhesion layer of said second metal layer is TaN.

* * * * *